(12) United States Patent
Pellizzer et al.

(10) Patent No.: US 7,639,526 B2
(45) Date of Patent: Dec. 29, 2009

(54) METHOD FOR MULTILEVEL PROGRAMMING OF PHASE CHANGE MEMORY CELLS USING A PERCOLATION ALGORITHM

(76) Inventors: Fabio Pellizzer, Via Peroz, 16, Follina 31051 (IT); Agostino Pirovano, Via Don A. Barera, 10, Corbetta 20011 (IT)

(*) Notice: Subject to any disclaimer, the term of this patent is extended or adjusted under 35 U.S.C. 154(b) by 42 days.

(21) Appl. No.: 11/949,598

(22) Filed: Dec. 3, 2007

(65) Prior Publication Data
US 2008/0151612 A1 Jun. 26, 2008

Related U.S. Application Data

(63) Continuation of application No. PCT/EP2006/062812, filed on Jun. 1, 2006.

(30) Foreign Application Priority Data
Jun. 3, 2005 (EP) .................................. 05104877

(51) Int. Cl.
*G11C 11/00* (2006.01)
(52) U.S. Cl. ...................... 365/163; 365/148; 365/100; 365/46
(58) Field of Classification Search ................. 365/163, 365/148, 100, 46
See application file for complete search history.

(56) References Cited

U.S. PATENT DOCUMENTS

| | | | |
|---|---|---|---|
| 3,886,577 A | 5/1975 | Buckley | |
| 3,922,648 A | 11/1975 | Buckley | |
| 5,825,046 A | 10/1998 | Czubatyj et al. | |
| 2003/0123277 A1 | 7/2003 | Lowrey et al. | |
| 2003/0185047 A1 | 10/2003 | Khouri et al. | |
| 2006/0024950 A1* | 2/2006 | Choi et al. | 438/626 |

FOREIGN PATENT DOCUMENTS

| | | |
|---|---|---|
| EP | 0326254 B1 | 5/1995 |
| EP | 1450373 A1 | 8/2004 |

* cited by examiner

*Primary Examiner*—Thong Q Le
(74) *Attorney, Agent, or Firm*—Blakely, Sokoloff, Taylor & Zafman LLP

(57) ABSTRACT

A method and apparatus for programming a phase change memory cell is disclosed. A phase change memory cell includes a memory element of a phase change material having a first state, in which the phase change material is crystalline and has a minimum resistance level, a second state in which the phase change material is amorphous and has a maximum resistance level, and a plurality of intermediate states with resistance levels there between. The method includes using programming pulses to program the phase change memory cell in either the set, reset, or one of the intermediate states. To program in the intermediate states, a programming pulse creates a crystalline percolation path having an average diameter through amorphous phase change material and a second programming pulse modifies the diameter of the crystalline percolation path to program the phase change memory cell to the proper current level.

27 Claims, 7 Drawing Sheets

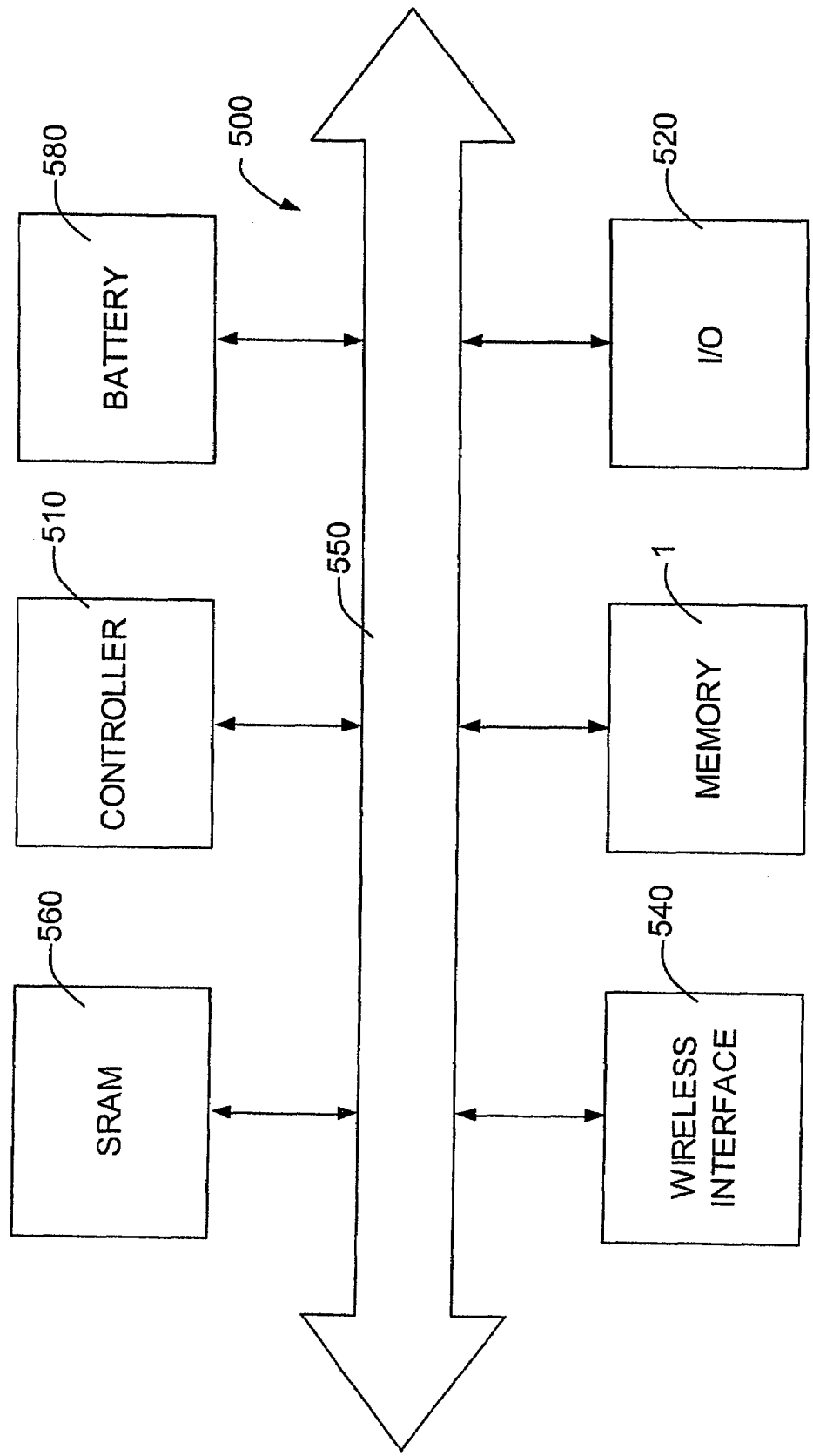

METHOD FOR MULTILEVEL PROGRAMMING OF PHASE CHANGE MEMORY CELLS USING A PERCOLATION ALGORITHM

BACKGROUND OF THE INVENTION

1. Field of the Invention

The present invention relates to a method for multilevel programming of phase change memory cells and to a multilevel phase change memory device.

2. Description of the Related Art

As is known, phase change memories use a class of materials that have the property of switching between two phases having distinct electrical characteristics, associated with two different crystallographic structures of the material: an amorphous, disorderly phase, and a crystalline or polycrystalline, orderly phase. The two phases are hence associated to resistivities of considerably different values.

Currently, the alloys of elements of group VI of the periodic table, such as Te or Se, referred to as chalcogenides or chalcogenic materials, can be used advantageously in phase change memory cells. The currently most promising chalcogenide is formed from an alloy of Ge, Sb and Te ($Ge_2Sb_2Te_5$), which is now widely used for storing information on overwritable disks and has been also proposed for mass storage.

In chalcogenides, the resistivity varies by two or more orders of magnitude when the material passes from the amorphous (more resistive) phase to the crystalline (more conductive) phase, and vice versa.

Phase change can be obtained by locally increasing the temperature. Below 150° C., both phases are stable. Starting from an amorphous state, and raising the temperature above 200° C., there is a rapid nucleation of the crystallites and, if the material is kept at the crystallization temperature for a sufficiently long time, it undergoes a phase change and becomes crystalline. To bring the chalcogenide back to the amorphous state it is necessary to raise the temperature above the melting temperature (approximately 600° C.) and then rapidly cool off the chalcogenide.

Memory devices exploiting the properties of chalcogenic material (also called phase change memory devices) have been already proposed.

The composition of chalcogenides suitable for the use in a phase change memory device and a possible structure of a phase change element is disclosed in a number of documents (see, e.g., U.S. Pat. No. 5,825,046).

As discussed in US-A-2003/0185047, a memory element of a phase change memory device comprises a chalcogenic material and a resistive electrode, also called a heater.

In fact, from an electrical point of view, the crystallization temperature and the melting temperature are obtained by causing an electric current to flow through the resistive electrode in contact or close proximity with the chalcogenic material and thus heating the chalcogenic material by Joule effect.

In particular, when the chalcogenic material is in the amorphous, high resistivity state (also called the reset state), it is necessary to apply a voltage/current pulse of a suitable length and amplitude and allow the chalcogenic material to cool slowly. In this condition, the chalcogenic material changes its state and switches from a high resistivity to a low resistivity state (also called the set state).

Vice versa, when the chalcogenic material is in the set state, it is necessary to apply a voltage/current pulse of suitable length and high amplitude so as to cause the chalcogenic material to switch to the amorphous phase.

As already mentioned, the resistivity of phase change materials may vary several orders of magnitude upon switching between the fully set (crystalline) state to the fully reset (amorphous) state. A typical range, for example, is 1 mΩ*cm in the set state to 1000 mΩ*cm in the reset state. However, the resistivity of the amorphous chalcogenic material is not stable and continuously increases according to a sub-linear law after phase transition. Thus, a quite rapid resistivity drift may take place, especially when large extensions of chalcogenic material are brought to the amorphous state.

The resistivity drift would not normally cause major problems in conventional two-level phase change memory cells, since the gap between the set state and the reset state is increased as well. Multilevel programming, instead, is not compatible with the resistivity drift, at present. According to conventional programming methods, in fact, every time a programming cycle is started, phase change memory cells are first brought to the fully crystalline state and then partially amorphized through a single voltage or current pulse, which lasts until a desired intermediate resistivity level is achieved. In this manner, however, large amorphous regions are still created, which are subjected to resistivity drift. The gap between the intermediate programming levels may not be kept constant and is narrowed on account of the resistivity drift. Thus, a sense amplifier associated with multilevel cells would fail to distinguish adjacent levels in a relatively short time after each phase transition. Moreover, the configuration of the large amorphous regions that are every time created greatly affects the resistivity level, but is not predictable. Thus, repeating identical programming cycles on the same phase memory change cell may lead to different resistivity levels.

BRIEF SUMMARY OF THE INVENTION

One embodiment of the invention is to provide a method for multilevel programming of phase change memory cells and a multilevel phase change memory device, which are free from the above-described drawbacks.

One embodiment of the present invention is a method for programming a phase change memory cell that includes a memory element of a phase change material having a first state, in which the phase change material is crystalline and has a minimum resistance level, a second state in which the phase change material is amorphous and has a maximum resistance level, and a plurality of intermediate states having associated resistance levels between $R_{MIN}$ and $R_{MAX}$. The method includes:

providing to the phase change memory cell a first programming pulse that creates a crystalline percolation path having an average diameter through the phase change material in the amorphous state; and providing to the phase change memory cell one or more additional programming pulses that modify the diameter of the crystalline percolation path to program the phase change memory cell in one of the intermediate states.

BRIEF DESCRIPTION OF THE SEVERAL VIEWS OF THE DRAWINGS

For the understanding of the present invention, preferred embodiments thereof are now described, purely as a non-limitative example, with reference to the enclosed drawings, wherein:

FIG. 9 is a system depiction of one embodiment of the present invention.

DETAILED DESCRIPTION OF THE INVENTION

Figure 1:
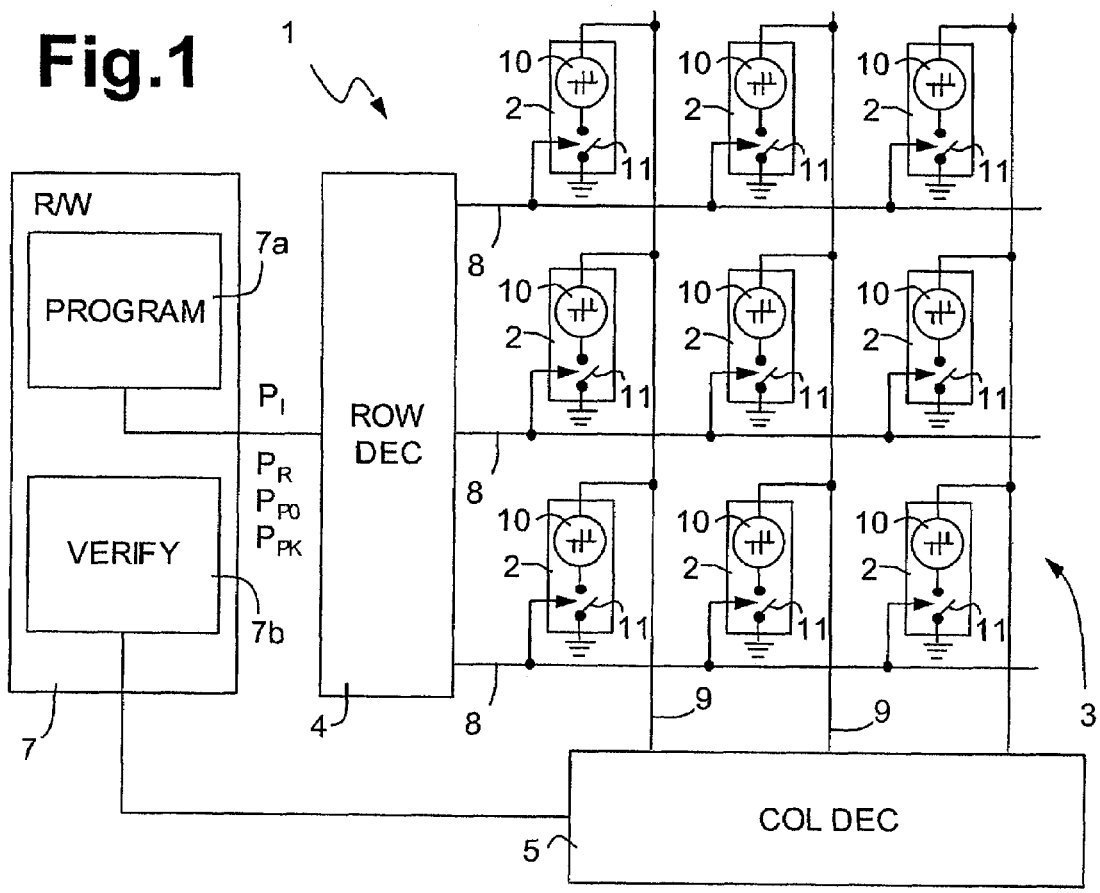
FIG. 1 shows a simplified block diagram of a phase change memory device implementing a programming method according to the present invention.

FIG. 1 shows a phase change memory ("PCM" hereinafter) device 1. A plurality of PCM cells 2 are arranged in rows and columns to form an array 3. A row decoder 4 and a column decoder 5 are coupled to a read/write unit 7, which includes a programming circuit 7a and a verify circuit 7b. Word lines 8 and bit lines 9 run parallel to rows and columns, respectively, and are selectively connectable to the read/write unit 7 through the row decoder 4 and the column decoder 5, in a known manner.

PCM cells 2 are connected at a cross-point of a word line 8 and a bit line 9 and include a memory element 10, of the phase change type, and a selection element 11. The memory element 10 has a first terminal connected to its respective bit line 9 and a second terminal connected to a first terminal of the selection element 11. The selection element 11 has a second terminal grounded and a control terminal connected to a word line 8. According to alternative solutions, the memory element 10 and the selection element 11 of each PCM cell 2 may be exchanged in position; moreover, the selection elements 11 may have two terminals only (e.g., diodes).

The programming circuit 7a is configured for providing initialization pulses $P_I$ and programming pulses $P_R$, $P_{PO}$, $P_{PK}$ (either current or voltage pulses) to selected PCM cells 2, according to a programming method described below. The verify circuit 7b is connected to the selected PCM cells 2 for reading the information stored therein (e.g., after each programming pulse).

Figure 2:
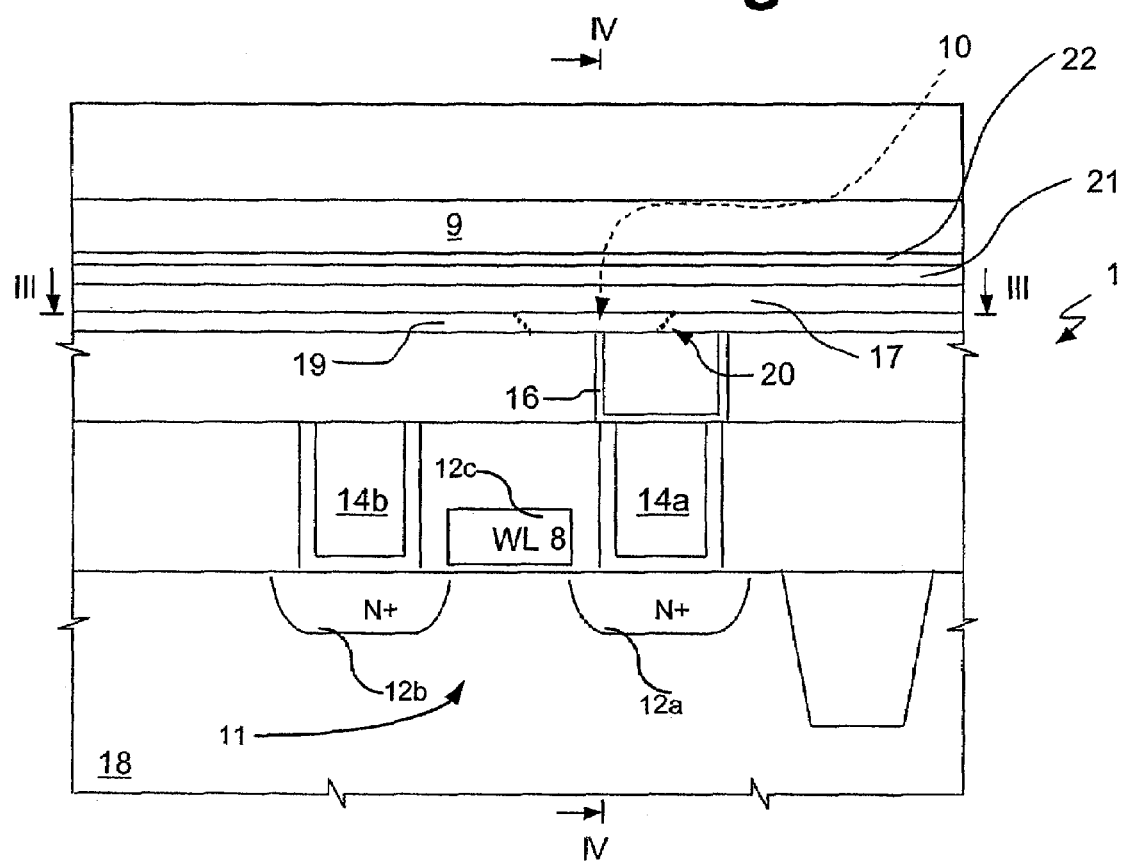
FIG. 2 is a cross section through a memory cell of the phase change memory device of FIG. 1.

A cross-section of a PCM cell 2 is illustrated in FIG. 2. In the embodiment herein described, the selection element 11 is a MOS transistor, but other selection elements may be used (e.g., a bipolar transistor). The MOS transistor 11 includes a drain region 12a, a source region 12b, a gate region 12c, and drain and source contacts 14a and 14b, respectively. The drain 12a and source 12b are formed with N+ implants. The gate 12c is made of polysilicon and extends above a semiconductor substrate 18 (of P-type) and is isolated there from. The gate 12c is connected to word line 8 and, when activated, turns the transistor on by creating a conductive channel between the drain 12a and source 12b. The MOS transistor may be in saturation and used as a voltage-controlled current-source selector.

Figure 3:
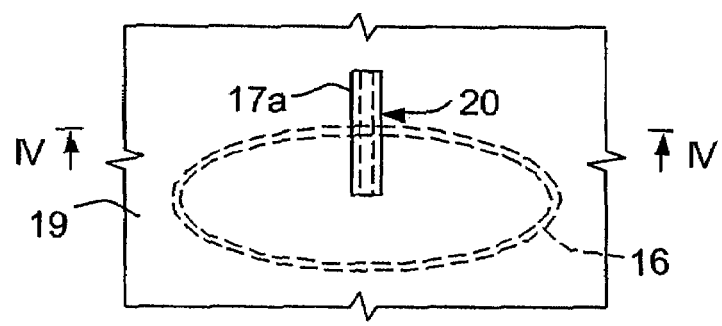
FIG. 3 is a top plan view, taken along the line III-III of FIG. 2.
Figure 4:
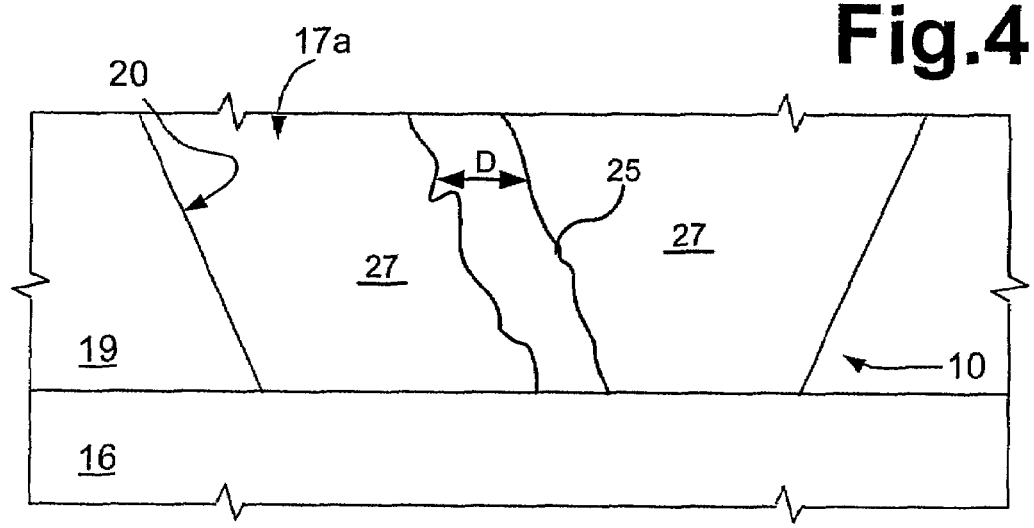
FIG. 4 is a cross section taken along the lines IV-IV of FIG. 2 and FIG. 3.

A cup-shaped heating element 16 is formed on the drain contact 14a. An upper portion of the heating element 16 is defined by a circular or oval wall having sublithographic thickness, as also shown in FIG. 3. Here, the term "sublithographic" means a linear dimension smaller than the minimum dimension achievable with current optical (UV) lithographic techniques, and hence smaller than 100 nm, preferably 50-60 nm, down to approximately 5-20 nm. A strip 17 of a chalcogenic material, e.g., GST, runs parallel to the bit lines 9 and is partly separated from the heating element 16 by a minitrench layer 19 (e.g., nitride). Additionally, a cap layer 21 and a barrier layer 22 are positioned between and parallel to the strip 17 and bit lines 9. An elongated minitrench 20 (see also FIG. 3) is formed through the minitrench layer 19 above and across the heating element 16 in a direction parallel to the bit lines 9. Thus, a thin portion 17a of the strip 17 fills the minitrench 20 and contacts the heating element 16, as shown in FIG. 4. Downwardly, the minitrench 20 has a sublithographic width in a direction parallel to the word lines 8, so that a contact area between the thin portion 17a of the strip 17 and the heating element 16 has sublithographic extension as well. The memory element 10 of the PCM cell 2 is formed in the thin portion 17a of the strip 17 at the contact area. On account of the sublithographic extension of the contact area, even relatively small currents flowing through the strip 17 and the heating element 16 will provide sufficient heating by Joule effect to cause phase transitions in a volume corresponding to the memory element 10.

In particular, a small amount of current can be used to create a percolation path 25 having an average diameter D within the minitrench 20. The percolation path 25 is a crystalline path that passes through the phase change material 27, which is in an amorphous state. Thus, the percolation path 25 passes within the thin portion 17a and continuously from the heating element 16 to the strip 17. Once a percolation path 25 is formed, a pulse with increased amplitude can be used to increase the diameter of the path, as further described below. Information stored in PCM cells 2 is associated to predetermined resistance levels (programming states) of the chalcogenic material forming the memory elements 10. Thus, by changing the diameter of the percolation path 25, the resistance levels can be correspondingly changed. The particular resistance levels and ranges will vary depending on the application. For example, isotropic scaling of devices will reduce the dimensions of the memory elements 10 and will correspondingly increase their resistance levels.

All the PCM cells 2 may be initialized once after manufacturing, in order to minimize the variability of their programming characteristics. To this end, the program circuit 7a supplies the PCM cells 2 with a single initialization pulse $P_I$ having such amplitude and duration as to bring the chalcogenic material of the memory elements 10 first to the fully reset state and then to the fully set state. The chalcogenic material is thus made uniform and possible irregularities are removed. The initialization pulse $P_I$ may be a current or voltage sloped pulse that allows slow cool off of the chalcogenic material. As an alternative, a decreasing stepped ramp would be acceptable as well.

Figure 5:
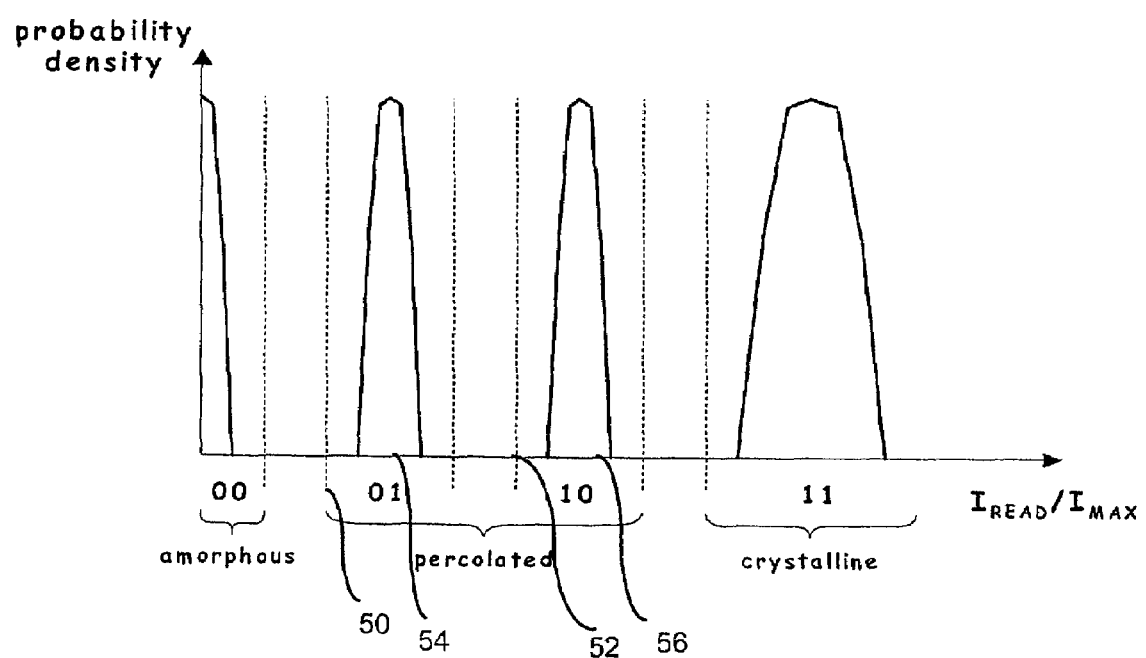
FIG. 5 is a plot showing read current levels and margins for multi-level programming according to the present invention.

FIG. 5 shows a plot of the probability density versus current for a four-state PCM cell (additional states may be added by further sub-dividing the current ranges as is well-known in the art). It is desirable to use the full programming range including the "00" (amorphous) and "11" (crystalline) to allow more margin for the intermediate levels "01" and "10". In this case, "00" is an amorphous state associated with reset bits. Reset is typically obtained with a single square pulse (e.g., 50 ns) that drives the chalcogenide material to a melting point of approximately 600° C. and then rapidly cools it. Level "11" is associated to set bits in an all crystalline state. Set is typically obtained with a single square pulse that drives the chalcogenide material up to crystallization temperature (e.g., 400° C.) and maintains it there until long-range order is reconstructed. Alternatively, set can be obtained by driving the chalcogenide material to the melting point and then cooling it slowly enough for the crystals to reorganize.

Figure 6:
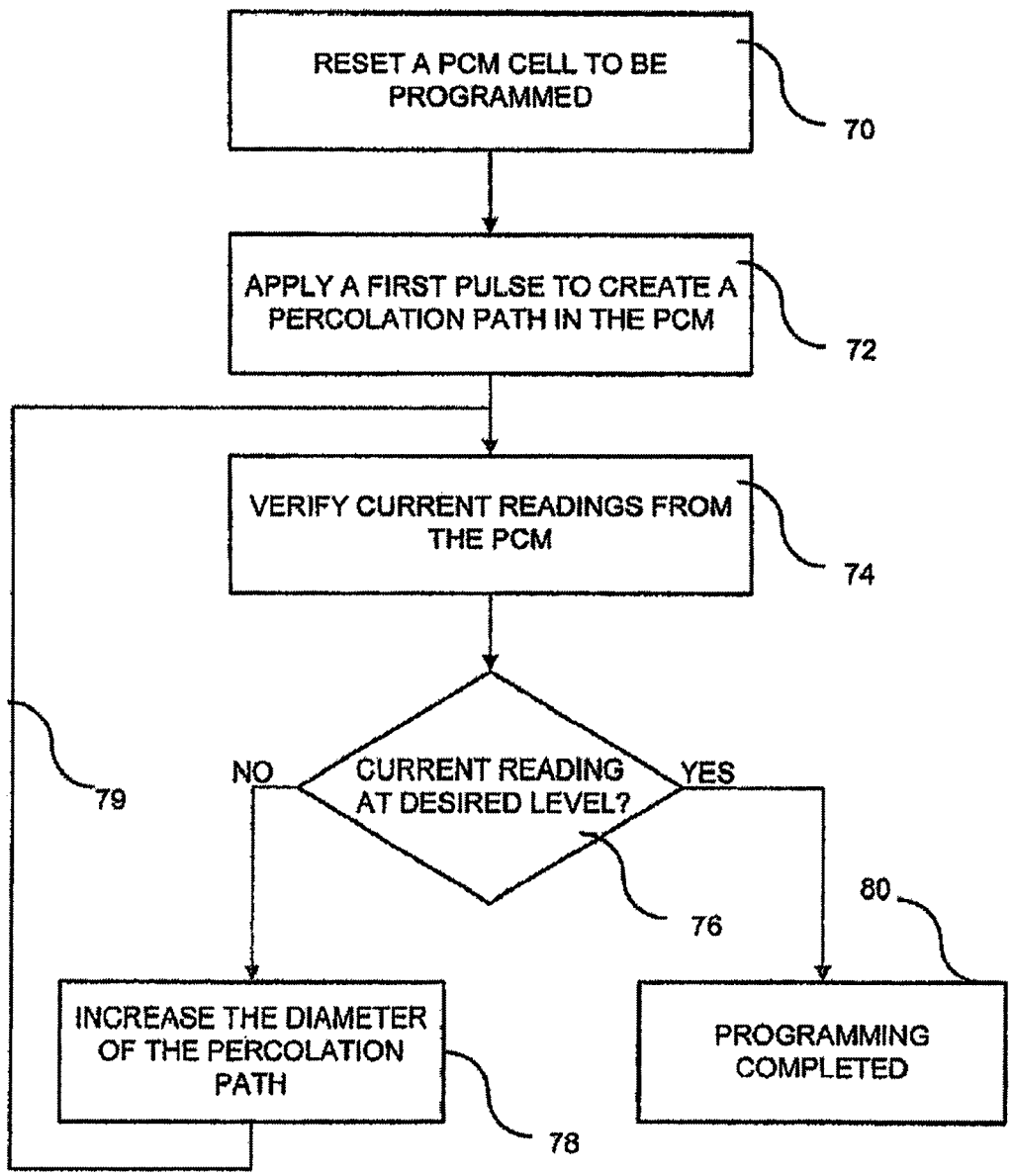
FIG. 6 is a flowchart of a method for programming a multi-level phase change memory element.

The two intermediate states "01", "10" generally employ additional programming pulses and the creation of a percolation path. The programming of the intermediate states is described more fully with respect to FIG. 6. Turning to FIG. 6, in process block 70, a reset pulse $P_R$ is applied to place the PCM in the amorphous state "00". Then the program circuit 7a is configured to provide a start programming pulse $P_{P0}$ and one or more adjust programming pulses $P_{PK}$. In process block 72, a start programming pulse $P_{P0}$ creates a percolation path of estimated diameter D to bring the current levels to either the start of the "01" range as shown at 50 (see FIG. 5) or the start of the "10" range as shown at 52 (FIG. 5), depending on the desired programming. This first percolation pulse is applied with a fixed current about five-times lower than typical crystallization currents. However, the current levels 50, 52 are not the desired current levels. Rather, they represent a starting point to bring the PCM to the target current levels, which fall under the curves as indicated at 54, 56. In process block 74, the verify circuit 7b reads the current of the PCM cell to see if the current is within the desired ranges as indicated at 54, 56 in FIG. 5. To accomplish this, the verify circuit 7b applies a predetermined voltage and compares the currents that flow through the selected PCM cells 2.

In decision block 76, a determination is made whether the read current is within the desired range (i.e., 54 for "01" or 56 for "10"). If the current reading is below the desired level, in process block 78, the programming circuit 7a applies a pulse having an increased amplitude and the same width as the previous pulse applied. A pulse of increased amplitude will result in an increase in the diameter of the percolation path. As shown at arrow 79, process blocks 74, 76, and 78 are repeated with pulses of increasing amplitude and fixed width until the verify circuit 7b determines that the current readings are within the desired tolerances. If so, decision block 76 is answered in the affirmative and the programming is completed at process block 80. An alternative approach is to use pulses of fixed amplitude and increasing width.

Figure 7:
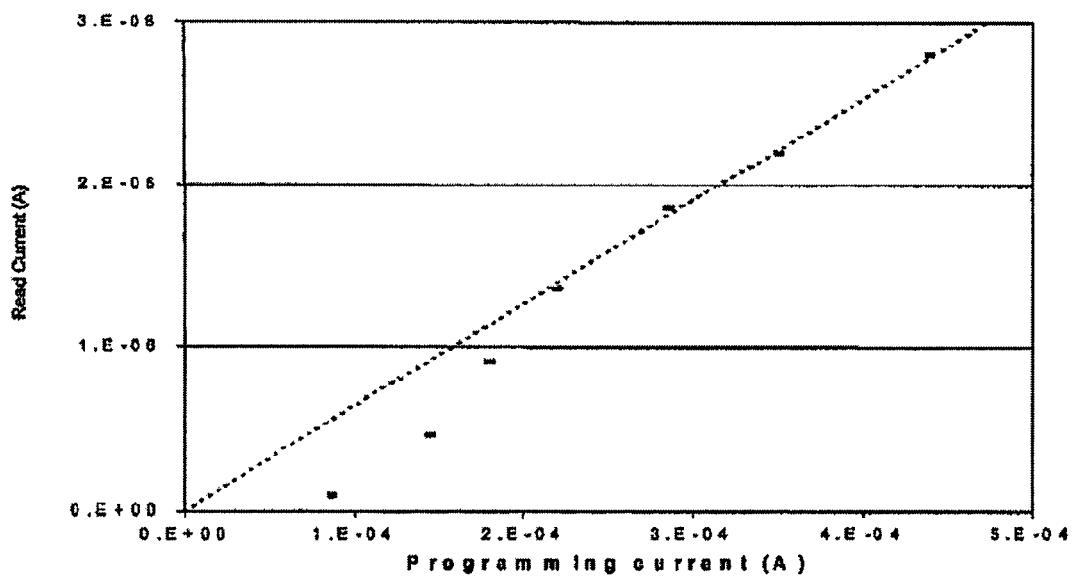
FIG. 7 is a plot showing the linear relationship between percolation programming current and read current of a percolated bit.

FIG. 7 is a plot showing the linear relationship between the programming current and the read current. Thus, increasing amplitude of the programming current results in a percolation path with a larger diameter or width and a correspondingly increased read current.

Figure 8:
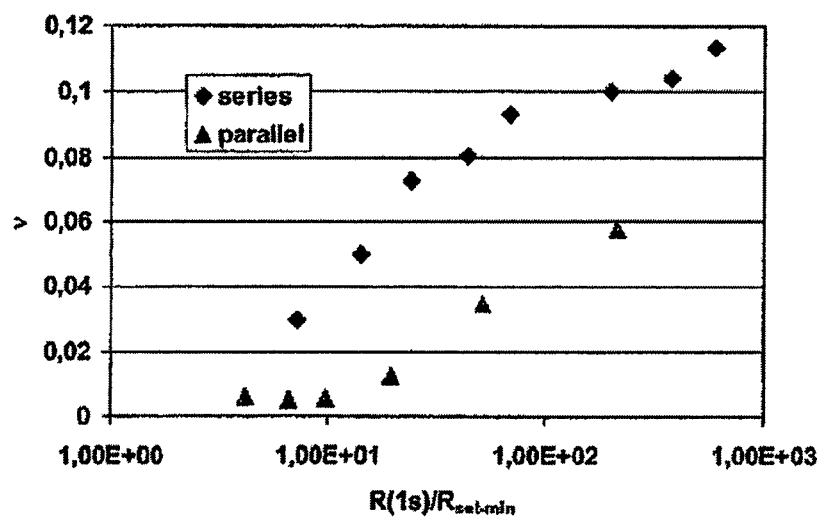
FIG. 8 is a plot showing a comparison between a drift exponent of homogenous bits and parallel percolated bits.

FIG. 8 shows one of the advantages of the present invention. Specifically, the percolation path provides a reduced resistance drift. The percolation path is a parallel current path through the chalcogenic material that effectively hides any series current components. The plot of the drift component for the percolation path is shown with the triangular plot points, whereas a series path, shown by diamonds, has higher resistance drift.

In FIG. 9, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, or a cellular network, although the scope of the present invention is not limited in this respect.

System 500 may include a controller 510, an input/output (I/O) device 520 (e.g., a keypad, display), the phase change memory device 1, a wireless interface 540, and a static random access memory (SRAM) 560 and coupled to each other via a bus 550. A battery 580 may supply power to the system 500 in one embodiment. It should be noted that the scope of the present invention is not limited to embodiments having any or all of these components.

Controller 510 may comprise, for example, one or more microprocessors, digital signal processors, micro-controllers, or the like. The phase change memory device 1 may be used to store messages transmitted to or by system 500. The phase change memory device 1 may also optionally be used to store instructions that are executed by controller 510 during the operation of system 500, and may be used to store user data. The instructions may be stored as digital information and the user data, as disclosed herein, may be stored in one section of the memory as digital data and in another section as analog memory. As another example, a given section at one time may be labeled as such and store digital information, and then later may be relabeled and reconfigured to store analog information.

The I/O device 520 may be used to generate a message. The system 500 may use the wireless interface 540 to transmit and receive messages to and from a wireless communication network with a radio frequency (RF) signal. Examples of the wireless interface 540 may include an antenna, or a wireless transceiver, such as a dipole antenna, although the scope of the present invention is not limited in this respect. Also, the I/O device 520 may deliver a voltage reflecting what is stored as either a digital output (if digital information was stored), or as analog information (if analog information was stored).

While an example in a wireless application is provided above, embodiments of the present invention may also be used in non-wireless applications as well.

Finally, it is clear that numerous variations and modifications may be made to programming method and to the phase change memory device described and illustrated herein, all falling within the scope of the invention as defined in the attached claims. In particular, the invention is not limited to the PCM cell structure as described above. Any kind of selecting elements and memory elements may be used, as well as any suitable shape of heating elements (wall heating elements, lance heating elements or other).

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The invention claimed is:

1. A method, comprising:
   programming a phase change memory cell, wherein the phase change memory cell includes a memory element of a phase change material having a first state, in which said phase change material is crystalline and has a first resistance level ($R_1$), a second state in which said phase change material is amorphous and has a second resistance level ($R_2$), and a plurality of intermediate states having associated resistance levels between $R_1$ and $R_2$, the programming including:
   providing to the phase change memory cell a first programming pulse that creates a crystalline percolation path having an average diameter through the phase change material in the amorphous state; and
   providing to the phase change memory cell one or more additional programming pulses that modify the average diameter of the crystalline percolation path to program the phase change memory cell in one of the intermediate states.

2. The method as claimed in claim 1, further including applying a reset programming pulse to place the phase change material in the second state prior to applying the first programming pulse.

3. The method according to claim 1, wherein the one or more additional programming pulses increase the average diameter of the crystalline percolation path.

4. The method according to claim 1, wherein each of the one or more additional programming pulses has an increasing amplitude and a width equal to a width of an immediately previous programming pulse of the programming pulses.

5. The method according to claim 1, wherein each of the one or more additional programming pulses have a fixed amplitude and an increasing width with respect to the previous programming pulse.

6. The method according to claim 1, further including:
(a) reading a current level of the phase change memory cell;
(b) if the current level is below a target current level for programming one of the intermediate states, then applying an additional programming pulse having a larger amplitude than a previous programming pulse;
(c) repeating (a) and (b) until the target current level is obtained.

7. A method according to claim 1, wherein said phase change memory cell is initialized before providing any programming pulses.

8. A method according to claim 7, wherein initializing said phase change memory cell comprises providing an initialization pulse having such amplitude and duration as to bring said chalcogenic material to said second state and then to said first state.

9. A phase change memory device, comprising:
a plurality of phase change memory cells, wherein each phase change memory cell includes a memory element of a phase change material having a first state, in which said phase change material is crystalline and has a first resistance level ($R_1$), a second state in which said phase change material is amorphous and has a second resistance level ($R_2$), and a plurality of intermediate states having associated resistance levels between $R_1$ and $R_2$; and
a program circuit structured to provide to said phase change memory cells a first programming pulse that creates a crystalline percolation path having an average diameter through the phase change material in the amorphous state and one or more additional programming pulses that modify the average diameter of the crystalline percolation path to program the phase change memory cell in one of the intermediate states.

10. The phase change memory device of claim 9, further including a verify circuit coupled to the programming circuit for reading a current from the phase change memory cell to determine if it reached the desired intermediate state.

11. The phase change memory device of claim 9 wherein the phase change memory cell includes a selector.

12. The phase change memory device of claim 11, wherein the selector includes either a MOS or bipolar transistor.

13. The phase change memory device of claim 9, wherein the phase change memory cell includes a heating element.

14. The phase change memory device of claim 9, wherein the program circuit includes means for applying a reset programming pulse to place the phase change material in the second state prior to applying the first programming pulse.

15. The phase change memory device of claim 9, wherein the one or more additional programming pulses increase the average diameter of the crystalline percolation path.

16. The phase change memory device of claim 9, wherein each of the one or more additional programming pulses has an increasing amplitude and a width equal to a width of an immediately previous programming pulse of the programming pulses.

17. The phase change memory device of claim 9, wherein each of the one or more additional programming pulses have a fixed amplitude and an increasing width with respect to the previous programming pulse.

18. The phase change memory device of claim 9, wherein the program circuit includes means for initializing said phase change memory cell by providing an initialization pulse having such amplitude and duration as to bring said chalcogenic material to said second state and then to said first state.

19. A system comprising:
a processing unit;
an interface coupled to said processing unit; and
a nonvolatile phase change memory device coupled to said processing unit, the memory device including:
a plurality of phase change memory cells, wherein each phase change memory cell includes a memory element of a phase change material having a first state, in which said phase change material is crystalline and has a first resistance level, a second state in which said phase change material is amorphous and has a second resistance level, and a plurality of intermediate states having associated resistance levels between $R_1$ and $R_2$; and
a program circuit structured to provide to said phase change memory cells a first programming pulse that creates a crystalline percolation path having an average diameter through the phase change material in the amorphous state and one or more additional programming pulses that modify the average diameter of the crystalline percolation path to program the phase change memory cell in one of the intermediate states.

20. A system according to claim 19, wherein said interface is a wireless interface.

21. A method, comprising:
programming a phase change memory cell to an intermediate state between a first state, in which said phase change material is crystalline and has a first resistance level ($R_1$) and a second state in which said phase change material is amorphous and has a second resistance level ($R_2$), the intermediate state having an intermediate resistance level between $R_1$ and $R_2$, the programming including:
providing to the phase change memory cell a first programming pulse that creates a crystalline percolation path within the phase change material in the amorphous state; and
providing to the phase change memory cell one or more additional programming pulses that modify an average diameter of the crystalline percolation path to program the phase change memory cell in the intermediate state.

22. The method as claimed in claim 21, further including applying a reset programming pulse to place the phase change material in the second state prior to applying the first programming pulse.

23. The method according to claim 21, wherein the one or more additional programming pulses increase the average diameter of the crystalline percolation path.

24. The method according to claim 21, wherein each of the one or more additional programming pulses has an increasing amplitude and a width equal to a width of an immediately previous programming pulse of the programming pulses.

25. The method according to claim 21, wherein each of the one or more additional programming pulses have a fixed amplitude and an increasing width with respect to the previous programming pulse.

26. The method according to claim 21, further including:
(a) reading a current level of the phase change memory cell;
(b) if the current level is below a target current level for programming to the intermediate state, then applying an additional programming pulse having a larger amplitude than a previous programming pulse;
(c) repeating (a) and (b) until the target current level is obtained.

27. A method according to claim 21, wherein said phase change memory cell is initialized before providing any programming pulses by providing an initialization pulse having such amplitude and duration as to bring said chalcogenic material to said second state and then to said first state.

* * * * *